United States Patent [19]
Vo et al.

[11] Patent Number: 5,229,308
[45] Date of Patent: Jul. 20, 1993

[54] BIPOLAR TRANSISTORS WITH HIGH VOLTAGE MOS TRANSISTORS IN A SINGLE SUBSTRATE

[75] Inventors: Tuan A. Vo, Hawthorne; Mohamad M. Mojaradi, Los Angeles; Steven A. Buhler, Redondo Beach, all of Calif.

[73] Assignee: Xerox Corporation, Stamford, Conn.

[21] Appl. No.: 878,141

[22] Filed: May 4, 1992

Related U.S. Application Data

[63] Continuation-in-part of Ser. No. 722,736, Jun. 27, 1991, abandoned, which is a continuation of Ser. No. 516,389, Apr. 30, 1990, abandoned.

[51] Int. Cl.$^5$ .................... H01L 21/328; H01L 21/336
[52] U.S. Cl. ......................................... 437/31; 437/41; 437/44; 748/DIG. 9
[58] Field of Search .............. 437/31, 41, 44, 34, 437/56, 57; 357/23.4; 748/DIG. 9; 257/339

[56] References Cited
U.S. PATENT DOCUMENTS

| | | | |
|---|---|---|---|
| 4,628,341 | 12/1986 | Thomas | 357/42 |
| 4,887,142 | 12/1989 | Bertotti et al. | 357/43 |
| 4,914,051 | 4/1990 | Huie et al. | 437/59 |

OTHER PUBLICATIONS

Yamaguchi, Tadanori and Morimoto, Seiichi, "Process and Device Design of a 1000-V MOS IC", IEEE Transactions on Electron Devices, vol. ED-29, pp. 1171-1178, Aug. 1982.

*Primary Examiner*—T. N. Quach
*Attorney, Agent, or Firm*—Nola Mae McBain

[57] ABSTRACT

A method of manufacturing a semiconductor device having a bipolar transistor for ordinary logic operation, as well as a high voltage MOS transistor which are provided in a single semiconductor substrate. The process includes the steps of making high voltage MOS transistors which comprises the steps of n-well fabrication, first drift region fabrication, second drift region fabrication, source and drain contact region fabrication and making bipolar transistors within the same silicon substrate as the high voltage MOS transistors which includes the step of base region fabrication where the steps for fabricating the second drift region of the high voltage MOS transistor and the base region of the bipolar transistor are combined so that both regions are created simultaneously.

9 Claims, 7 Drawing Sheets

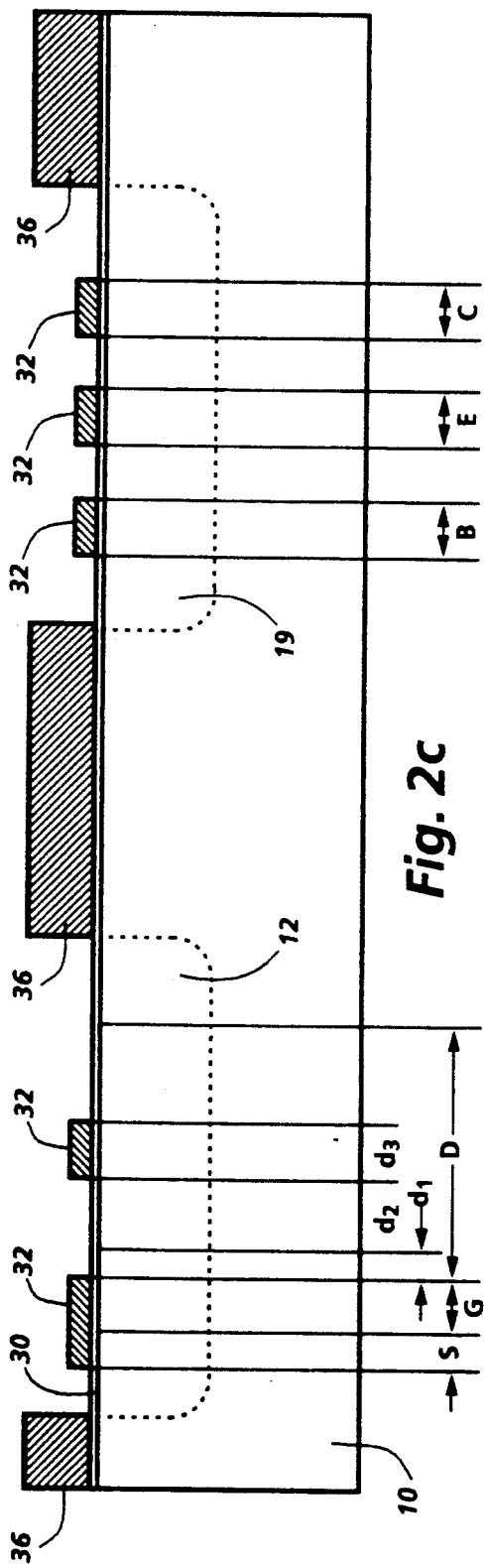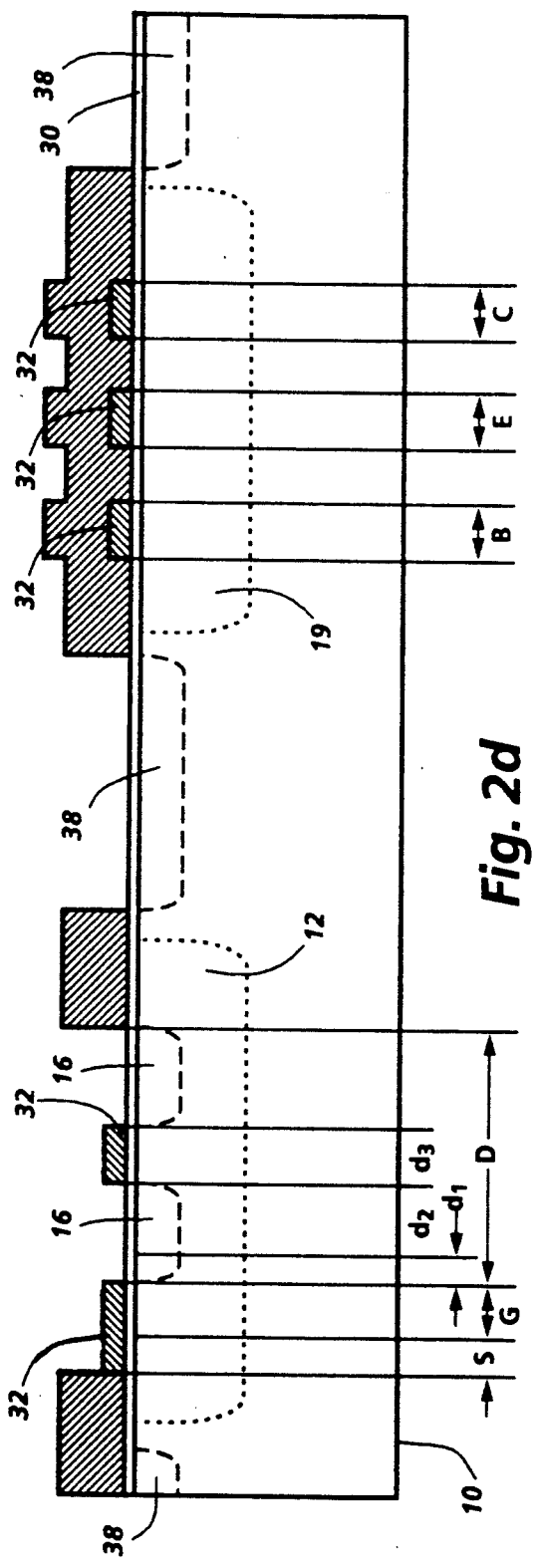

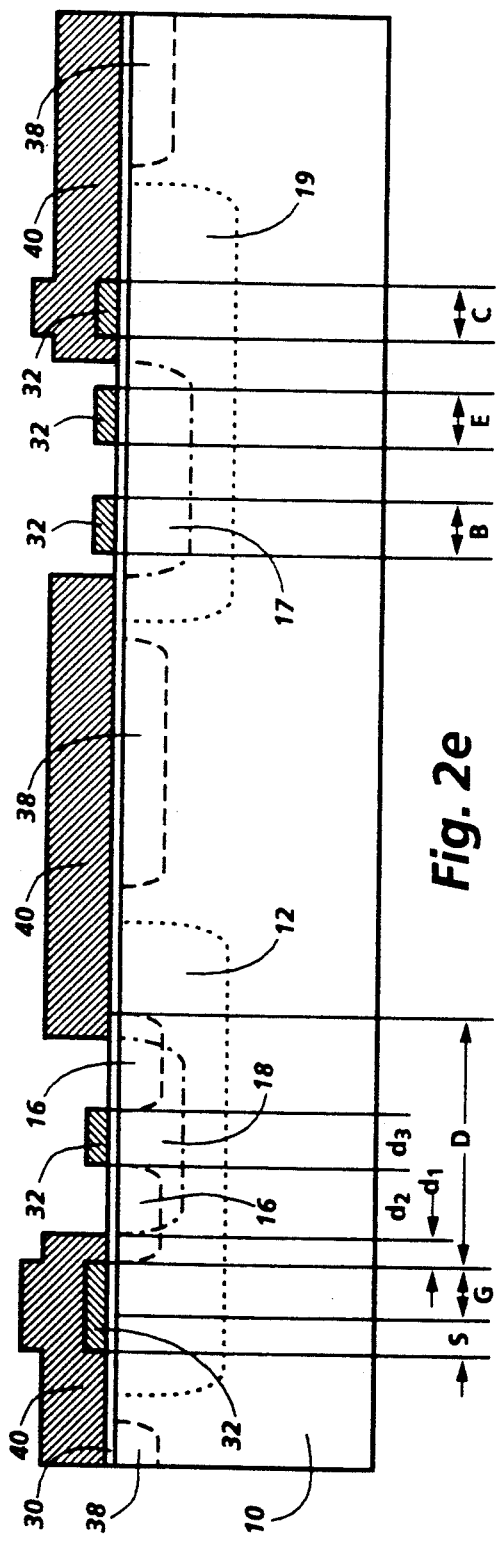
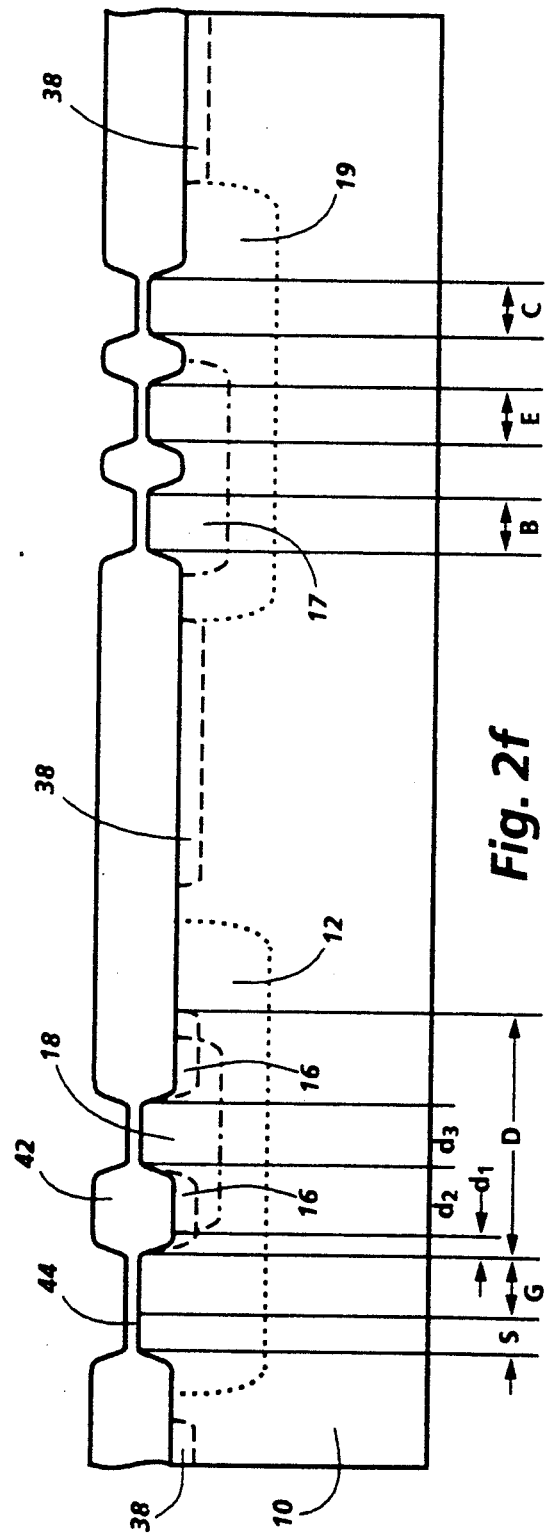
Fig. 2e
Fig. 2f

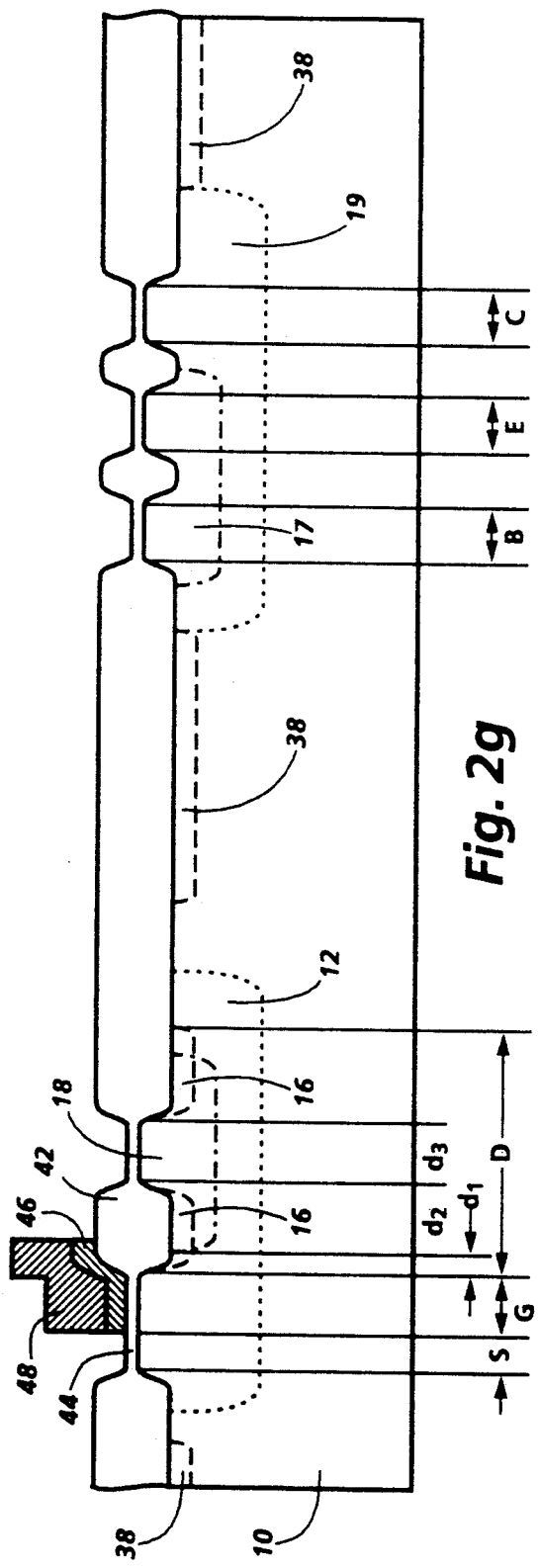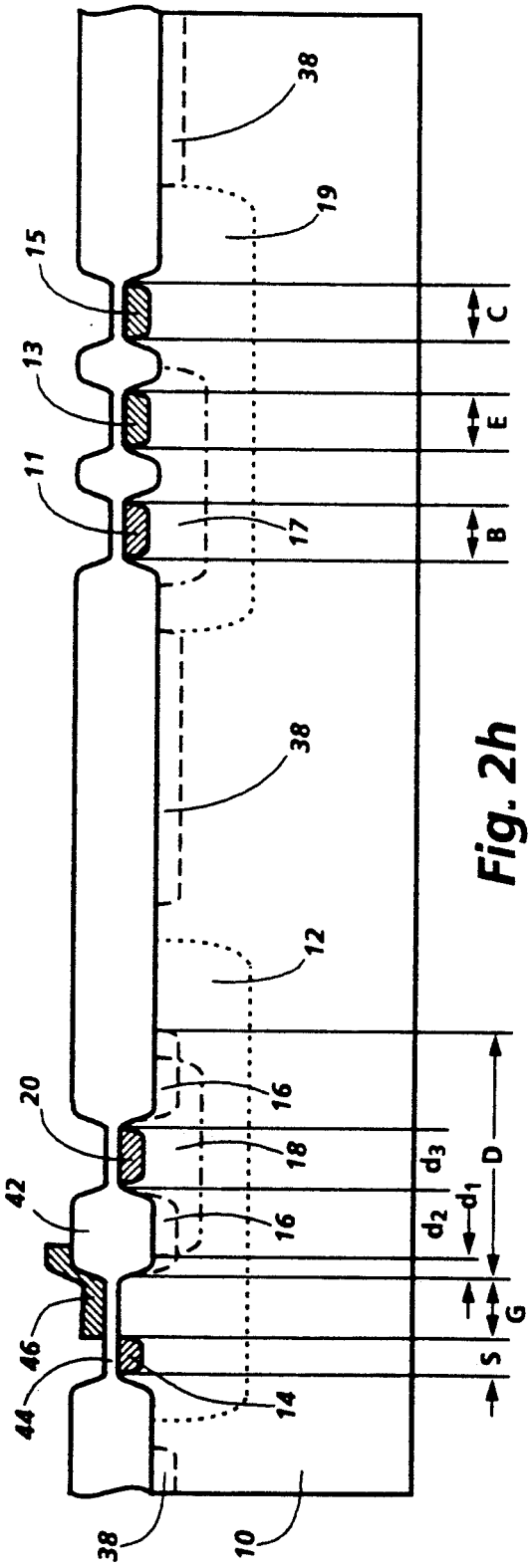

5,229,308

BIPOLAR TRANSISTORS WITH HIGH VOLTAGE MOS TRANSISTORS IN A SINGLE SUBSTRATE

CROSS REFERENCE TO RELATED APPLICATIONS

This application is a continuation in part of our application Ser. No. 07/722,736 filed on Jun. 27th, 1991, abandoned, which is a continuation of our application Ser. No. 07/516,389, filed Apr. 30th, 1990, abandoned, and is entitled to the filing date thereof.

BACKGROUND OF THE INVENTION

1. Field of the Invention

The present invention relates to a method of manufacturing a semiconductor device, and particularly a method which simplifies the processes by which a high voltage MOS (metal oxide semiconductor) transistor and a Bipolar transistor are manufactured in the same substrate.

2. Prior Art

BiMOS technology (bipolar and MOS transistors on a single semiconductor substrate) has become an increasingly attractive device technology because it can provide high performance (better than MOS alone) without high power consumption (much lower than bipolar alone). One of the recognized drawbacks in fabricating BiMOS devices is the increased processing required to produce both MOS and bipolar components on the same chip. This is because conventionally the processes remain separate, and thus the wafer must undergo two processing sequences, one for the bipolar transistor and one for the MOS transistor.

As shown by U.S. Pat. No. 4,868,135 a significant reduction in the number of steps used to produce both the bipolar transistor and a MOS transistor can be accomplished by using a process for fabricating the BiMOS device which includes certain common steps for the integration of the fabrication of the bipolar transistor and the MOS transistor. This process produces both the bipolar transistor and the MOS transistor simultaneously by incorporating similar structural features between the bipolar and the MOS transistors. A bipolar structure transistor is configured which is closer to and more compatible with that of the MOS transistors.

Normally, this type of process would be adequate for the production of both bipolar and MOS transistors on a single substrate, however, the MOS transistors fabricated by the above methodology are only good for a limited range of input voltages. These MOS transistors are only operable within normal, low voltage, ordinary applications. This process does not address the problem of specialized, high voltage applications where a MOS transistor of high breakdown voltage is needed.

When a high voltage MOS transistor is to be manufactured, the construction of the transistor and the method of manufacturing the transistor are determined upon consideration of the following problems:

(1) punch through phenomenon between the source and the drain in which a depletion layer extends to the source region if the length of the channel is small;
(2) dielectric breakdown between the gate and the drain (sustaining breakdown voltage) and;
(3) avalanche caused by the concentration of an electric field near the surface of the drain region which occurs when the drain region and the gate are overlaid with an interposed thin insulator film.

The present technology, as shown by U.S. Pat. No. 4,818,719, is that the above mentioned problems can be reduced, with a minimal impact on the device processing steps. This patent discloses a process where a first impurity region having a particular conduction type and serving as a channel stopper of the MOS transistor and a second impurity region having the same conduction type as the first impurity region and serving as an offset low doped layer of the high voltage MOS transistor are produced simultaneously. This type of transistor, with an offset low doped layer in the drain in addition to the usual drain layer, is often called a doubly diffused drain MOS transistor or a DMOS transistor. The offset low doped layer is often called a drift region. The drift region has a much lower impurity concentration then the adjacent drain area and connects the transistors gate region with the adjacent drain area. While this method provides a reasonably good high voltage transistor there is still considerable room for improvement in the sustaining breakdown voltage characteristics.

Improvements in the DMOS transistor alone resulting in better operating characteristics have been discussed in *Process and Device Design of a 1000-v MOS IC* by Tadanori Yamaguchi and Seiichi Morimoto in *IEEE Trans. Electron Devices*, vol ED-29, pp. 1171-1178, August 1982. This paper discusses a process sequence for making a double diffused drain (two separate increasing implant concentration regions) high voltage MOS transistor and contemplates extension of the process to a triple diffused drain (three separate increasing implant concentrations) high voltage MOS transistor to obtain high voltage transistors with preferred operating characteristics at the cost of increased processing steps.

In the above described conventional procedures, MOS transistors of ordinary low voltage logic operation may be fabricated in common with bipolar transistors. In order to fabricate a high voltage MOS transistor with a bipolar transistor it has been conventional for one skilled in the art to combine the separate processes steps as known for each technology into a combined processing sequence incorporating all the individual steps of both technologies. Since, the sustaining breakdown voltage of a MOS greatly depends on the concentration of the impurity in the drift region, the standard practice for fabricating a bipolar transistor and a high voltage MOS transistor in the same substrate has been to control the impurity concentrations for each transistor within their separate processes. This has resulted in overly complicated processing plans, which are undesirable as they contain excessive processing steps and are time consuming and costly. Some effort has been spent in the area of combining processing steps efficiently to produce high voltage MOS transistors (U.S. Pat. No. 4,818,719) but this effort has not been directed at producing high voltage MOS transistors in an efficient manner with bipolar transistors because the resulting process sequences have been unduly burdensome.

SUMMARY OF THE INVENTION

An efficient process for constructing a high voltage triple diffused drain MOS transistor, with first and second drift regions, and a bipolar transistor in a single substrate is described. The process includes the step of forming the second drift region of the high voltage MOS transistor and the base region of the bipolar transistor in the same process step to improve process efficiency.

BRIEF DESCRIPTION OF THE DRAWINGS

FIG. 2a–2j shows the various stages of formation of the high voltage MOS transistor and the bipolar transistor of FIG. 1.

DETAILED DESCRIPTION OF THE PREFERRED EMBODIMENT

Figure 1:
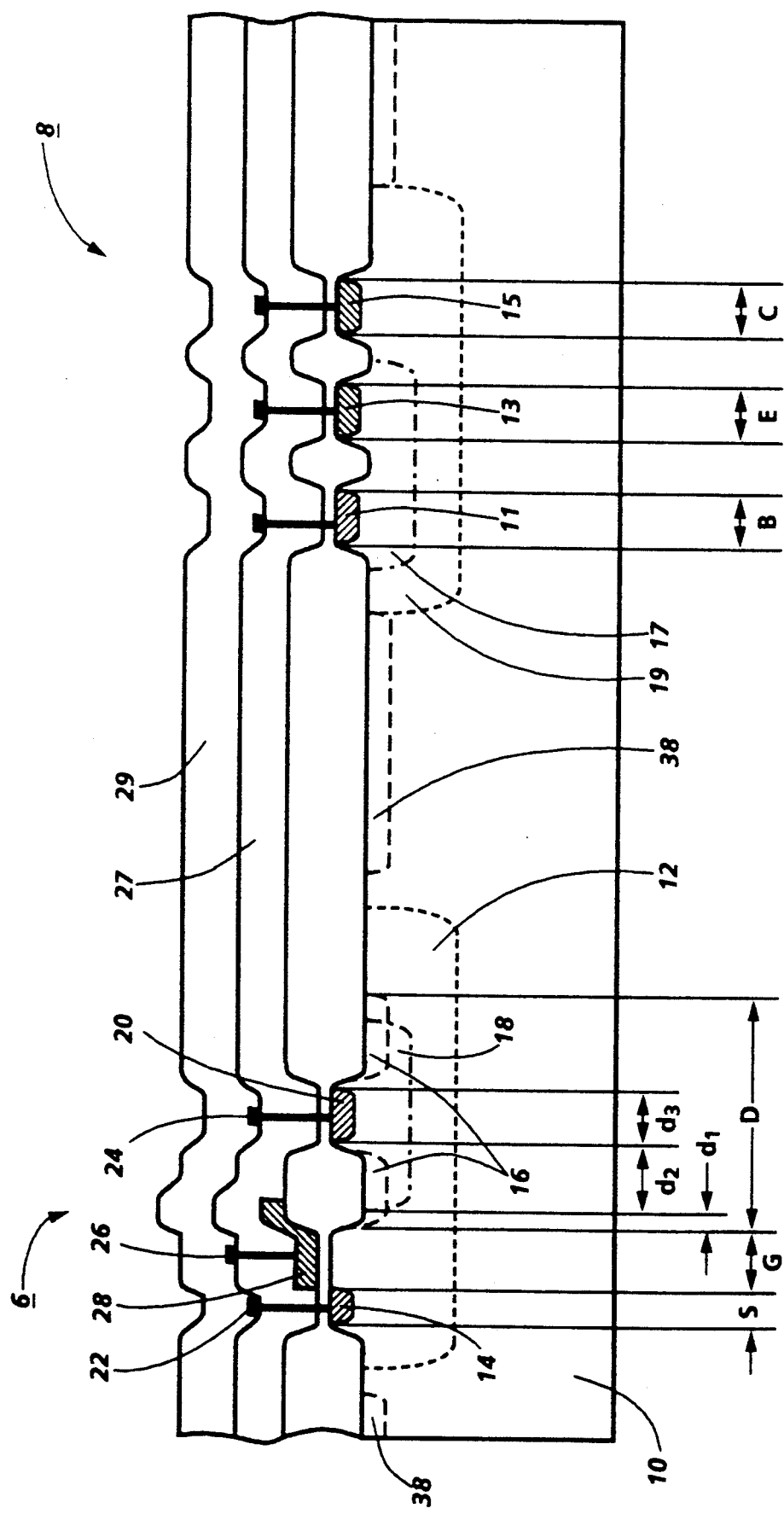
FIG. 1 shows a side view of a high voltage MOS transistor and a bipolar transistor fabricated according to the process of the embodiment of the invention.

Referring now to FIG. 1, there is shown an embodiment of a semiconductor device comprising a high voltage MOS transistor 6 and a bipolar transistor 8 created according to the method of the present invention. All of the process steps for deposition of materials, etching and patterning are known in the art. The high voltage MOS transistor 6 comprises a p-type silicon substrate 10 having a n-well region 12. A source contact region 14 of the transistor is composed of a p+-type region within the n-well region 12. A drain region "D" comprises 3 different p-type regions 16, 18, 20. Region 16 is annular in shape and has a certain carrier concentration forming a first drift region. Region 18 overlaps the annular region 16 and has a carrier concentration which is greater than region 16 forming a second drift region. Region 20 is the drain contact region and has a carrier concentration which is greater than either drift regions 16 and 18 and is located adjacent to region 16. It is the relative concentrations of these regions 16, 18, 20 which determine the breakdown characteristics of the high voltage MOS transistor 6. In between and adjacent to both the source contact region 14 and the drain region "D" is a gate region "G" which is n-type material. Traveling from the gate region "G" through the first drift region "d1", the second drift region "d2" to the drain contact region "d3", the carrier concentration rises. It is the lowest in the first drift region "d1" and the highest in the drain contact region "d3". Source electrodes 22 and drain electrodes 24 are provided and are made of metal and contact both the source contact region 14 and drain region "D" through the drain contact region 20. The gate region "G" contacts with a polysilicon gate layer 28 on the surface of the gate region "G" of the transistor. A bottom glass layer 27 is formed on the surface of the transistor structures. The bottom glass layer 27 insulates the transistors from metal interconnect lines. An insulative and protective layer of glass 29 resides on the surface of all the structures.

The bipolar transistor 8 comprises a heavily doped base contact region 11, an emitter region 13, and a collector region 15. A p-base region 17 is also present. The base contact region 11 and the emitter region 13 are formed within the p-base region 17. The p-base region 17 and the collector region 15 are contained within a n-well region 19. The operation and formation of bipolar transistors is well known in the art.

Referring now to FIGS. 2a through 2j a sequence of process steps used to manufacture the high voltage MOS transistor 6 and the bipolar transistor 8 according to the present invention is shown. Thicknesses of the layers shown are not necessarily proportional.

Figure 2A:
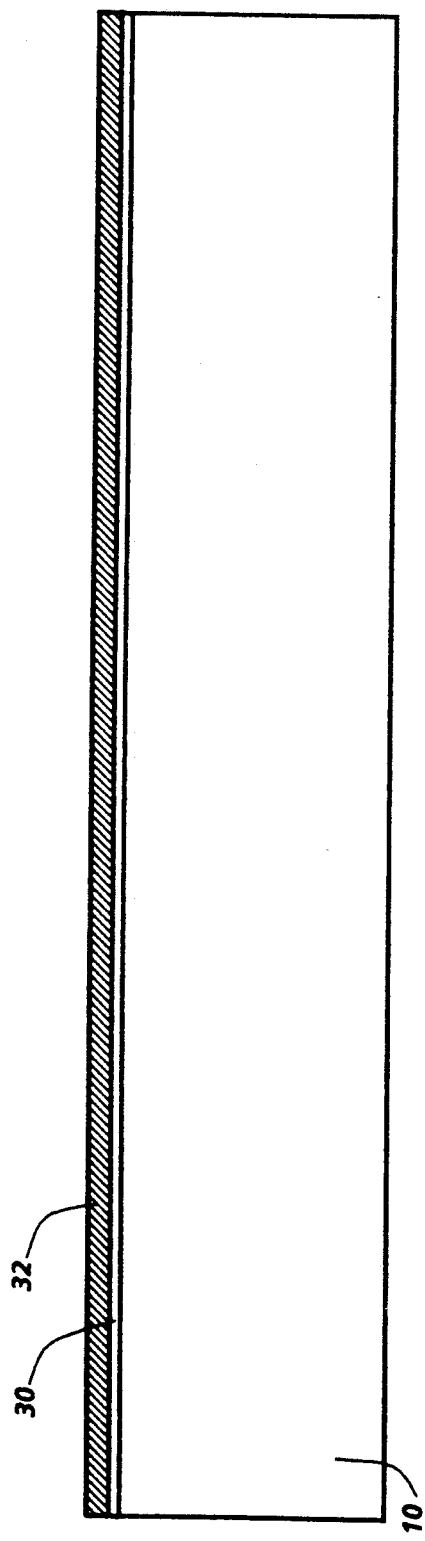

In FIG. 2a there is shown the p-type silicon substrate 10 with an initial oxide layer 30 grown on substrate 10 and an initial nitride layer 32 deposited on the silicon oxide layer 30. The oxide layer is grown using conventional methods and may be from 200 Å to 500 Å thick. The nitride layer is deposited using conventional methods and may be from 800 Å to 1200 Å thick.

Figure 2B:
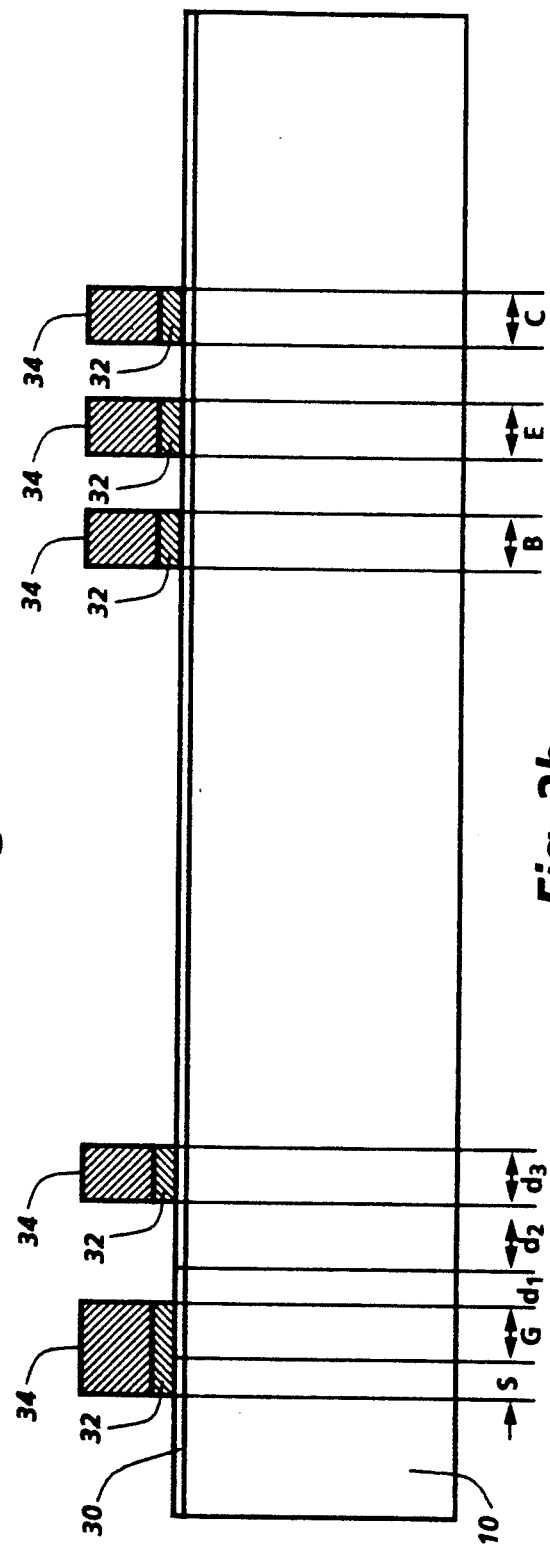

In FIG. 2b, using conventional patterning techniques, a photoresist layer 34 with a thickness of from 1.0 μm to 2.0 μm is formed. The nitride layer 32 shown in FIG. 2a is then etched to provide the nitride structure 32 shown in FIG. 2b. This remaining nitride layer 32 defines the regions that will eventually become the diffusion areas of the high voltage MOS transistor 6 and the bipolar transistor 8. The source contact region 14, drain contact region 20, base contact region 11, emitter region 13, and the collector region 15 have all been designated and will be formed underneath the remaining nitride layer 32 in subsequent steps.

Subsequently, as shown in FIG. 2c, n-wells 12, 19 are formed by use of the n-well mask forming a new photoresist pattern 36 and a subsequent n-well implant, these steps being performed in the conventional manner. A conventional high energy implant process utilizing a dosage from $1 \times 10^{12}$ atoms per square centimeter to $5 \times 10^{12}$ atoms per square centimeter with an energy level from 200 Kev to 300 Kev is used to penetrate the nitride/oxide pattern. Since the photoresist 36 is approximately ten times thicker than either nitride or oxide, the implant will not penetrate through the photoresist pattern but will penetrate the oxide 30 and nitride 32 not covered by the photoresist 36. The photoresist layer 36 is deposited according to conventional techniques.

In the next process step shown in FIG. 2d, boron field implant regions are made using the same conventional masking process steps and implantation process steps used in forming the n-well region 12. The boron field implants are implanted at a concentration of $5 \times 10^{12}$ atoms per square centimeter to $9 \times 10^{12}$ atoms per square centimeter and an energy of 20 Kev to 30 Kev. After drive-in, the concentration of boron will be between approximately $1 \times 10^{17}$ atoms per cubic centimeter to $5 \times 10^{17}$ atoms per cubic centimeter. The field implants will provide both the channel stop regions 38 and the first drift region contact 16 within the drain region "D" of the transistor. Since the implant is performed with a low energy, the nitride layer will block the field implant.

Until now, the process has followed a conventional CMOS process pattern using only a conventional sequence of process steps. At this point the process deviates from the conventional sequence. Using a photo resist pattern 40 and the conventional implanting techniques of the previous steps, a p-well implant region is made as is shown in FIG. 2e. The implant dosage is in the range of $5 \times 10^{12}$ atoms per square centimeter to $9 \times 10^{12}$ atoms per square centimeter and the implant energy is from 85 Kev to 110 Kev. After drive-in, the concentration of boron will be between approximately $3.5 \times 10^{17}$ atoms per cubic centimeter to $6.5 \times 10^{17}$ atoms per cubic centimeter. However, unlike conventional sequences, this process step will simultaneously make both the second drift region implant 18 of the high voltage MOS transistor and the base region 17 of the bipolar transistor 8. This enables the production of the high voltage MOS transistor 6 with bipolar transistors 8 without using the extra masks and implant steps that would be needed in a traditional process. These steps can be combined for any processes that seek to make both bipolar and high voltage MOS transistors on a single substrate. Since the implant is performed with a high energy, the nitride layer will not block the implant.

The completion of the transistor is shown in FIGS. 2f through 2j and follows well known and conventional process techniques.

In FIG. 2f, the remaining nitride layer 32 is etched away, and field oxides 42 and gate oxides 44 are grown. The field oxides are from 1000 Å to 9000 Å thick and the gates oxides are from 200 Å to 400 Å thick. Notice also, that some lateral diffusion of the channel stop region 38 occurs resulting in contact between the channel stop region 38 and n-well region 19.

Subsequently, the polysilicon gate 46 of the transistor is shown after formation in FIG. 2g. The steps of polysilicon deposition, definition of polysilicon areas with a new mask and photoresist pattern 48, and then poly etch of all areas not protected by photoresist 48 are performed. The polysilicon gate 46 has a thickness of from 3000 Å to 5000 Å.

Once again, the mask and photoresist pattern is changed to define the N+implant areas that will become the emitter area 13 and the collector area 15 (see FIG. 2h) for the bipolar transistor and those areas are implanted with phosphorus at an implant level of $5 \times 10^{15}$ atoms per square centimeter to $5 \times 10^{16}$ atoms per square centimeter at an energy level of from 70 Kev to 80 Kev. Then the mask and photoresist pattern is changed to define the source contact 14 and drain contact 20 areas of high voltage transistor and the base contact region 11 of the bipolar transistor, and these areas are implanted with boron. The boron implantation is at a dosage of $1 \times 10^{15}$ atoms per square centimeter to $5 \times 10^{15}$ atoms per square centimeter and energy level of from 55 Kev to 75 Kev. This implant step will create the p+-type source implant region 14 as well as the final p+area in the drain contact region 20 and the base contact region 11 of the bipolar transistor as is shown in FIG. 2h.

The high voltage transistor has three concentration regions, "d1", "d2", "d3" within the drain region "D". Region "d1" is the first drift region and is the area where only the first drift region implant 16 has been implanted. The concentration of this region "d2" is between approximately $1 \times 10^{17}$ atoms per cubic centimeter to $5 \times 10^{17}$ atoms per cubic centimeter. Region "d2" is the second drift region and is located where the first drift region implant 16 and the second drift region implant 18 overlap. Because the concentrations are additive the resultant concentration is between approximately $4.5 \times 10^{17}$ atoms per cubic centimeter to $11.5 \times 10^{17}$ atoms per cubic centimeter. Region "d3" is the just finished drain contact region 20.

It is the now finished triple diffused "d1", "d2", "d3" drain region "D" that gives the transistor its special high voltage characteristics. Depending upon scalable device dimensions, this transistor operates within a voltage range of 50 volts to 200 volts, well above the normal operating range of conventional transistors of 5 volts. This drain region "D" is composed of three separate increasing implant concentration regions, first and second drift regions "d1", "d2", and the drain contact region "d3" that were made in the steps shown in FIGS. 2d, 2e, and 2h. In contrast to the conventional processes for making a high voltage transistor, the processing of the triple diffused drain high voltage transistor of the above described invention is effected by combining step sequences with other structures to be present on the semiconductor device, so that a transistor of increased complexity can be built without increasing the complexity of the processing sequence.

Figure 2I:
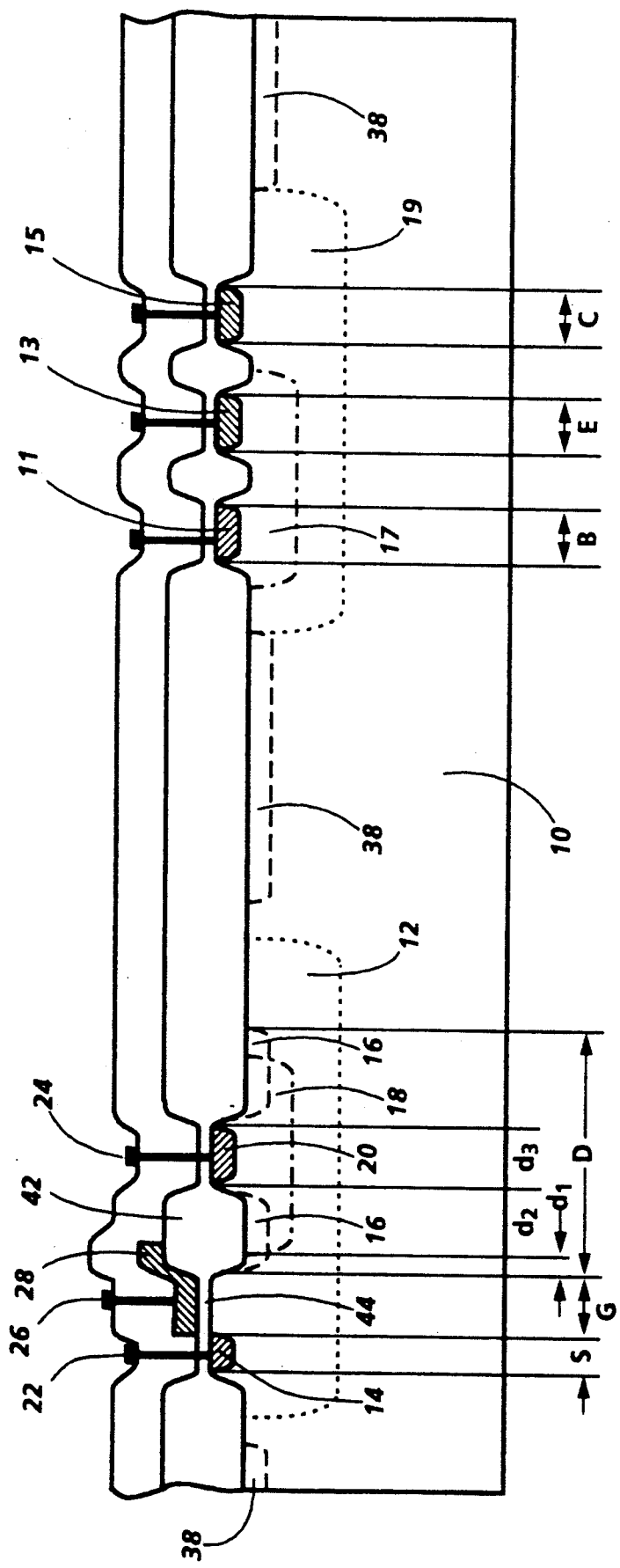
Figure 2J:
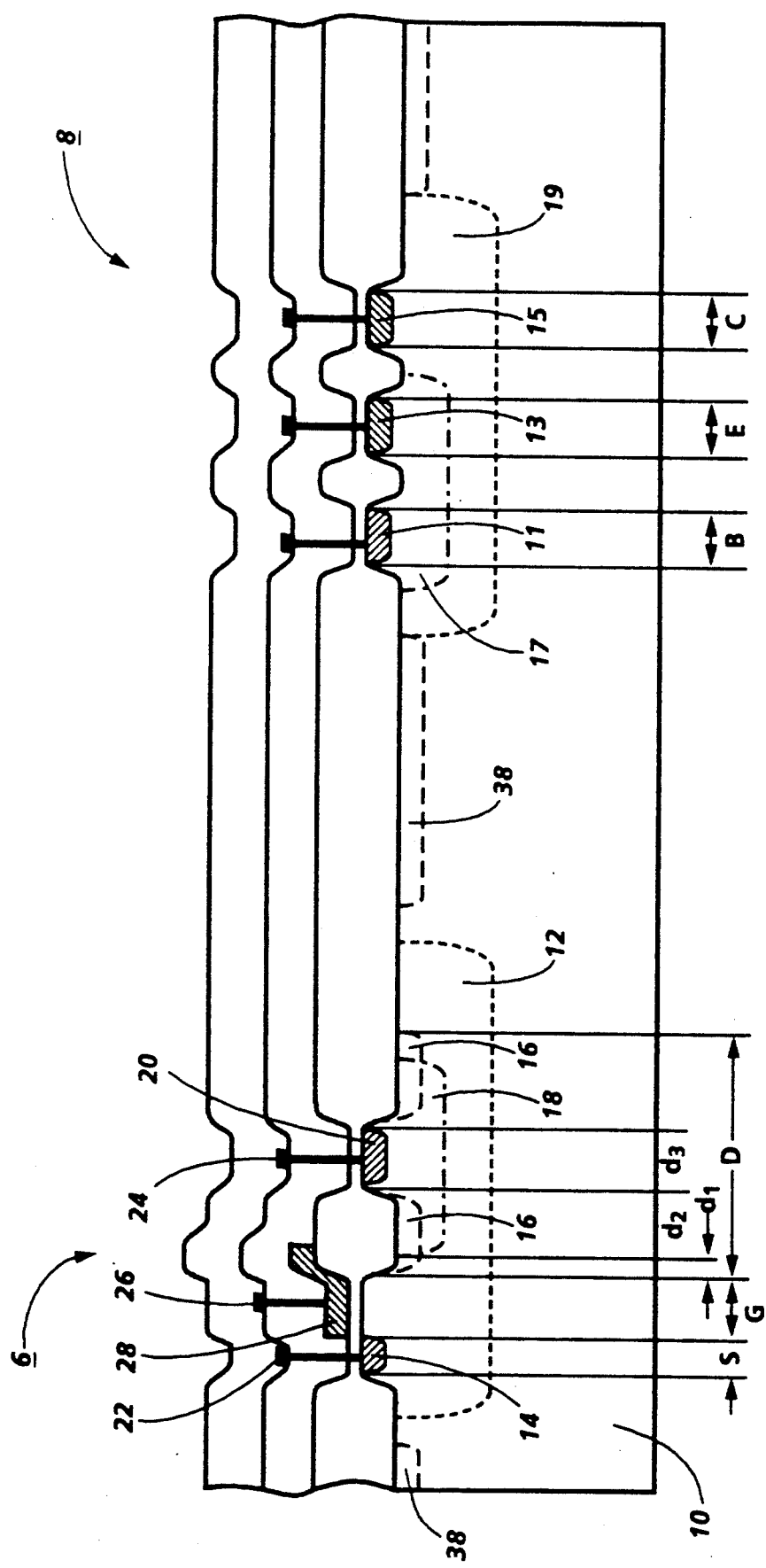

The remaining processes shown in FIGS. 2i through 2j for making contacts, metal lines, electrodes 22, 24, 26 passivation layers etc. are all done in a conventional manner to complete the integrated semiconductor device shown in FIG. 1.

While the first and second drift region implants 16,18 are shown as overlapped, it is possible to configure the photomasks differently to change the structure. Therefore, the first and second drift region implants 16, 18 might be adjacent to one another rather than overlapped.

Although the invention has been described as being fabricated on a p-type substrate, it is understood that there is an equivalent process where the transistors could be fabricated on a n-type substrate. In this equivalent process, boron would be implanted wherever phosphorus had been implanted and phosphorus would be implanted wherever boron had been implanted. This would result in an equivalent transistor where all n-type structures would now be p-type structures and all p-type structures would now be n-type structures.

Although the invention has been described with reference to particular means, methods, and embodiments, it is to be understood that the invention is not confined to the embodiment described in the foregoing and illustrated herein, but extends to all equivalents within the spirit and the scope of the claims.

What is claimed is:

1. A process for the simultaneous production of a bipolar transistor and a high voltage MOS transistor comprising the steps of:
   (A) Providing a substrate having:
      (i) at least on the high voltage MOS transistor portion a designated source region; a designated gate region adjacent to said designated source region; a designated drain region adjacent to said designated gate region; and within said designated drain region a designated first drift region adjacent to said designated gate region, a designated drain contact region separated from said designated first drift region, and a designated second drift region interposed between said designated first drift region and said designated drain contact region;
      (ii) at least on the bipolar transistor portion a designated base region; a designated emitter contact region, and a designated collector contact region;
   (B) forming a first drift region by implanting a given carrier to a given first concentration within said designated first drift region;
   (C) forming a second drift region by implanting said given carrier to a given second concentration substantially higher than the first concentration and simultaneously forming a base region by implanting said given carrier in said designated base region of said bipolar transistor portion; and
   (D) thereafter performing steps to complete the high voltage MOS transistor and the bipolar transistor.

2. The process in claim 1 wherein the steps to complete the high voltage MOS transistor and the bipolar transistor comprise:
   (A) forming a source contact region and a drain contact region by implanting within said designated source region and said designated drain contact region said given carrier of a given third concentration substantially higher than said second concentration of the second drift region; and (B) forming a collector contact region and an emitter contact region by implanting a second carrier within said designated collector contact region and said designated emitter contact region.

3. The process in claim 1 wherein the first drift region is formed prior to the simultaneous formation of said second drift region and said base region.

4. The process in claim 1 wherein the carrier first concentration is between approximately $1 \times 10^{17}$ and $5 \times 10^{17}$ carriers per cubic centimeters.

5. The process in claim 1 wherein the carrier second concentration is between approximately $4.5 \times 10^{17}$ and $11.5 \times 10^{17}$ carriers per cubic centimeter.

6. The process in claim 1 wherein said given carrier is boron.

7. The process in claim 1 wherein the second carrier is phosphorus.

8. The process in claim 1 wherein the step of:

(A) Providing a substrate having:
   (i) at least on the high voltage MOS transistor portion a designated source region; a designated gate region adjacent to said designated source region; a designated drain region adjacent to said designated gate region; and within said designated drain region a designated first drift region adjacent to said designated gate region, a designated drain contact region separated from said designated first drift region, and a designated second drift region interposed between said designated first drift region and said designated drain contact region;
   (ii) at least on the bipolar transistor portion a designated base region, a designated emitter contact region, and a designated collector contact region;

is accomplished by:

(A) growing a thin oxide on the surface of said substrate;

(B) depositing a nitride layer on the surface of said thin oxide;

(C) patterning said nitride layer to designate:
   (i) at least on the high voltage MOS transistor portion a designated source region, a designated gate region adjacent to said designated source region, a designated drain region adjacent to said designated gate region, and within said designated drain region a designated first drift region adjacent to said designated gate region, a designated drain contact region separated from said designated first drift region, and a designated second drift region interposed between said designated first drift region and said designated drain contact region,
   (ii) at least on the bipolar transistor portion a designated base region, a designated emitter contact region, and a designated collector contact region.

9. The process in claim 8 wherein performing steps to complete the high voltage MOS transistor and the bipolar transistor are:

(A) forming a source contact region and a drain contact region by implanting, within said designated source region and said designated drain contact region, said given carrier to a given third concentration substantially higher than said second concentration; and (B) forming a collector contact region and an emitter contact region by implanting a second carrier within said designated collector contact region and said designated emitter contact region.

* * * * *